United States Patent
Jo

(10) Patent No.: US 11,854,817 B2
(45) Date of Patent: Dec. 26, 2023

(54) MANUFACTURING METHOD FOR DEEP TRENCH CAPACITOR WITH SCALLOPED PROFILE

(71) Applicant: KEY FOUNDRY CO., LTD., Cheongju-si (KR)

(72) Inventor: Seung Mo Jo, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 85 days.

(21) Appl. No.: 17/669,970

(22) Filed: Feb. 11, 2022

(65) Prior Publication Data
US 2023/0009146 A1   Jan. 12, 2023

(30) Foreign Application Priority Data
Jul. 8, 2021   (KR) .......... 10-2021-0089577

(51) Int. Cl.
*H01L 21/3065*   (2006.01)
*H01L 49/02*   (2006.01)

(52) U.S. Cl.
CPC ........ *H01L 21/30655* (2013.01); *H01L 28/84* (2013.01); *H01L 28/87* (2013.01); *H01L 28/91* (2013.01)

(58) Field of Classification Search
CPC ............. H01L 29/66181; H01L 29/975; H01L 28/90–92; H01L 21/3065; H01L 21/30655; H01L 28/82–84
See application file for complete search history.

(56) References Cited

U.S. PATENT DOCUMENTS

| | | |
|---|---|---|
| 6,284,148 B1 | 9/2001 | Laermer et al. |
| 6,387,773 B1 * | 5/2002 | Engelhardt ........ H10B 12/0387 438/386 |
| 6,939,805 B2 | 9/2005 | Lützen et al. |

(Continued)

FOREIGN PATENT DOCUMENTS

| | | |
|---|---|---|
| KR | 10-2017-0078535 A | 7/2017 |
| KR | 10-2020-0066549 A | 6/2020 |

OTHER PUBLICATIONS

Chang, Bingdong, et al. "DREM: Infinite etch selectivity and optimized scallop size distribution with conventional photoresists in an adapted multiplexed Bosch DRIE process." Microelectronic Engineering 191 (2018): 77-83.

(Continued)

*Primary Examiner* — Jose R Diaz
(74) *Attorney, Agent, or Firm* — NSIP Law

(57) ABSTRACT

A manufacturing method for a deep trench, the method includes forming a first trench in a substrate and performing a first cycle and a second cycle. Each comprising performing a passivation operation forming a passivation film on a sidewall and a bottom surface of the first trench, performing a first etching with a first bias power to remove the passivation film formed on the bottom surface of the first trench to expose the bottom surface of the first trench, and performing a second etching with a second bias power etching the exposed bottom surface of the first trench to form a second trench disposed below the first trench. The first bias power and the second bias power in the second cycle is greater than the first bias power and the second bias power in the first cycle, respectively.

15 Claims, 12 Drawing Sheets

(56) References Cited

U.S. PATENT DOCUMENTS

| | | | |
|---|---|---|---|
| 7,560,360 B2 | 7/2009 | Cheng et al. | |
| 8,049,327 B2* | 11/2011 | Kuo | H01L 23/481 |
| | | | 257/621 |
| 8,492,874 B2* | 7/2013 | Lan | H01L 28/82 |
| | | | 257/534 |
| 9,178,080 B2 | 11/2015 | Kalnitsky et al. | |
| 10,079,277 B2* | 9/2018 | Yew | H01L 21/31116 |
| 10,692,966 B2 | 6/2020 | Yen et al. | |
| 11,088,239 B2 | 8/2021 | Chang et al. | |
| 11,361,971 B2* | 6/2022 | Chang | H01L 21/30655 |
| 2003/0052088 A1* | 3/2003 | Khan | H01L 29/66181 |
| | | | 438/719 |
| 2012/0129278 A1* | 5/2012 | Yoshii | B81C 1/00087 |
| | | | 257/E21.529 |
| 2015/0069581 A1* | 3/2015 | Chang | H01L 21/2633 |
| | | | 438/712 |
| 2017/0186837 A1 | 6/2017 | Yen et al. | |
| 2020/0176552 A1 | 6/2020 | Chang et al. | |
| 2021/0202761 A1* | 7/2021 | Cheng | H01L 21/02236 |
| 2021/0305360 A1* | 9/2021 | Shibata | H01L 29/66181 |

OTHER PUBLICATIONS

Korean Office Action dated Apr. 28, 2023, in counterpart Korean Patent Application No. 10-2021-0089577 (7 pages in Korean).

* cited by examiner

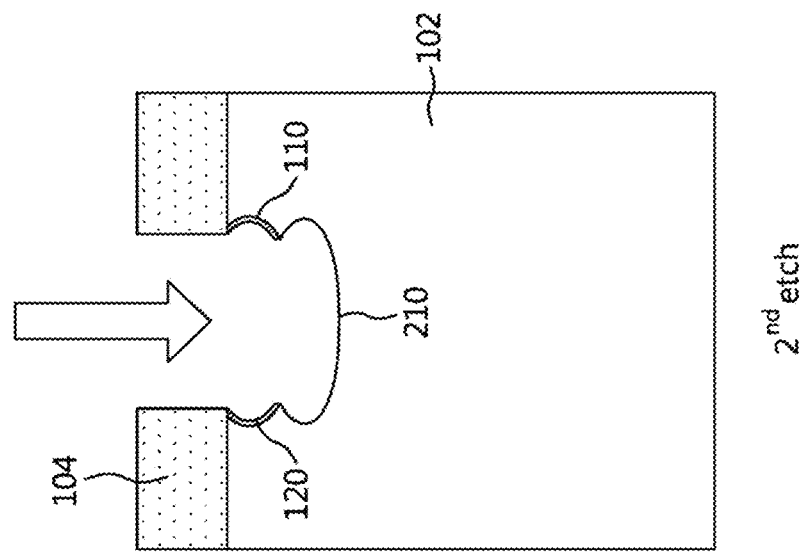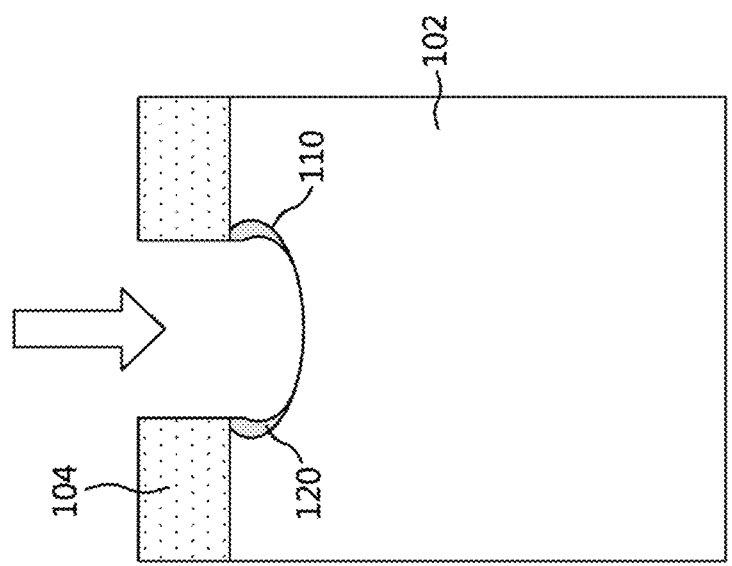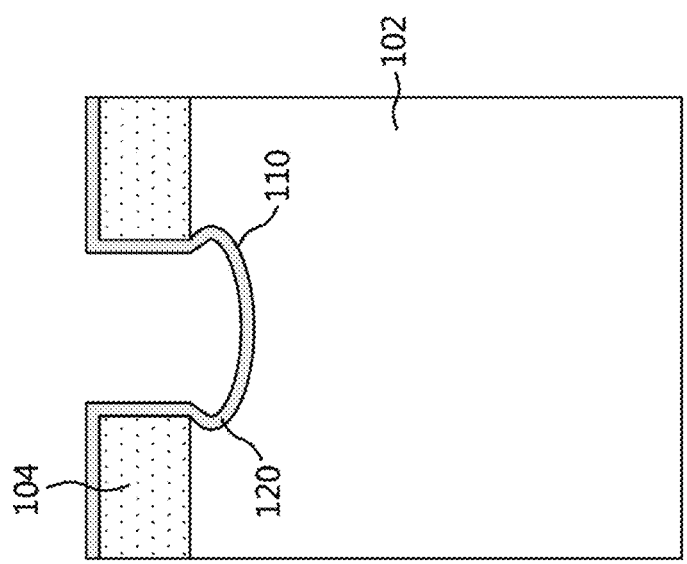

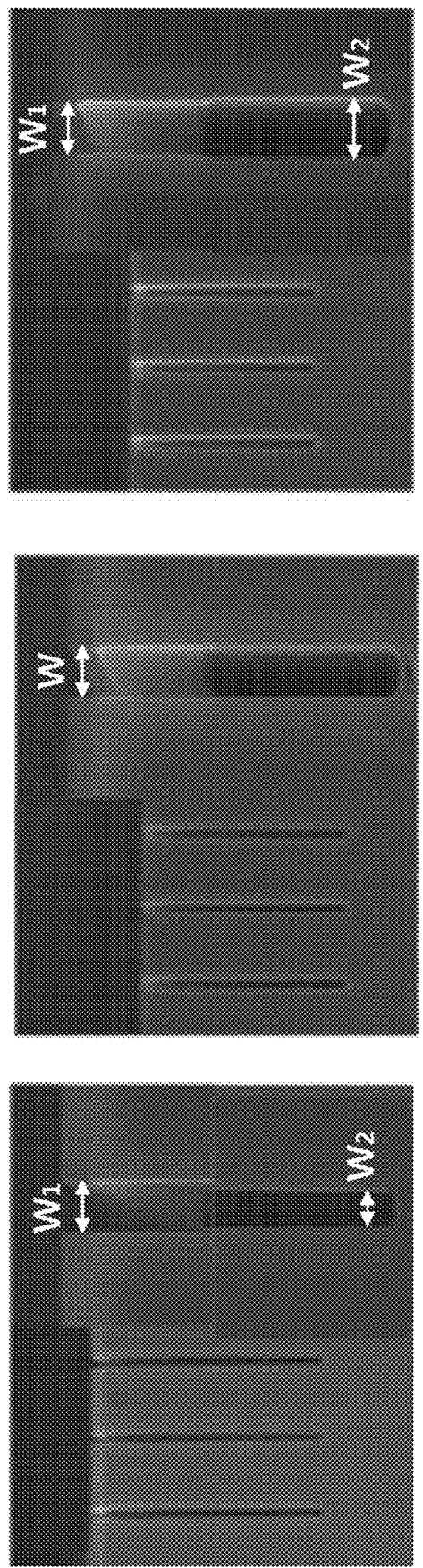

MANUFACTURING METHOD FOR DEEP TRENCH CAPACITOR WITH SCALLOPED PROFILE

CROSS-REFERENCE TO RELATED APPLICATION

This application claims the benefit under 35 U.S.C. § 119 of Korean Patent Application No. 10-2021-0089577 filed on Jul. 8, 2021, in the Korean Intellectual Property Office, the entire disclosure of which is incorporated herein by reference for all purposes.

BACKGROUND

1. Field

The following description relates to a manufacturing method for a deep trench capacitor with a scalloped profile to increase a capacitance of the deep trench capacitor.

2. Description of Related Art

A deep trench capacitor may be formed using a deep trench that is formed in semiconductor substrate with a vertical direction. The deep trench capacitor may increase the capacitance of a deep trench capacitor as much as the depth of a trench.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. In one general aspect, A manufacturing method for a deep trench, the method includes forming a first trench in a substrate and performing a first cycle and a second cycle. Each comprising performing a passivation operation forming a passivation film on a sidewall and a bottom surface of the first trench, performing a first etching with a first bias power to remove the passivation film formed on the bottom surface of the first trench to expose the bottom surface of the first trench, and performing a second etching with a second bias power etching the exposed bottom surface of the first trench to form a second trench disposed below the first trench. The first bias power and the second bias power in the second cycle is greater than the first bias power and the second bias power in the first cycle, respectively.

The first etching and the second etching may be performed with a first plasma source gas and a second plasma source gas, respectively. The first plasma source gas and the second plasma source gas may be similar.

A plasma source gas of the passivation operation may be different from the first and second plasma source gases.

The first bias power in the first etching may be greater than the second bias power in the second etching. A first chamber pressure employed in the first etching may be lower than a second chamber pressure employed in the second etching.

Each of the first cycle and the second cycle may have a same gas flow rate in the passivation operation.

The first and second etchings may be conducted with a reactively ionized etching process and an isotropic etching process, respectively. A sidewall profile of the first and second trenches may be balloon shaped or scallop shaped.

In another general aspect, a manufacturing method for a deep trench capacitor, the method includes forming a first trench having a first depth in a substrate, performing a passivation operation forming a protective film on a surface of the first trench, performing a first etching to remove a portion of the protective film, performing a second etching forming a second trench having a second depth under the first trench by etching the substrate, such that each of the first and second trenches has a scalloped profile, forming a first dielectric layer on the first and second trenches, forming a first conductive film on the first dielectric layer, forming a second dielectric layer on the first conductive film, forming a second conductive film on the second dielectric layer, forming a third dielectric layer on the second conductive film, and forming a third conductive film on the third dielectric layer.

The method may further include forming a conductive doping region in the substrate, and forming a contact plug contacting the third conductive film. The first conductive film and the third conductive film may be electrically connected to each other.

The first and second etchings may be conducted with a first bias power and a second bias power, respectively. A first bias power may be greater than a second bias power, and each of the first and second bias powers may be increased as a number of repeated cycle is increased.

A plasma source gas from the passivation operation may be different from plasma source gases from the first etching and the second etching. The plasma source gas from the passivation operation may be Octafluorocyclobutane ($C_4F_8$) plasma source gas, and the plasma source gases from the first etching and the second etching may be sulfur hexafluoride ($SF_6$) plasma source gas.

Each end of the deep trench capacitor may be connected to an adjacent deep trench capacitor.

The first and second etchings may be conducted with reactively ionized etching process and an isotropic etching process, respectively.

In another general aspect, a manufacturing method includes forming a trench in a substrate and sequentially performing a plurality of cycles. Each of the cycles includes forming a passivation film on a sidewall and a bottom surface of the trench, performing a first etching with a first bias power removing the passivation film formed on the bottom surface of the trench to expose the bottom surface of the trench, and performing a second etching with a second bias power etching the exposed bottom surface of the trench to form another trench disposed below the trench. The first bias power and the second bias power in a first cycle of the cycles is less than the first bias power and the second bias power in a subsequent cycle of the cycles, respectively. A sidewall of each of the trench and the another trench is oval shaped.

The first etching and the second etching may be performed with a first plasma source gas and a second plasma source gas, respectively, and the first plasma source gas and the second plasma source gas may be similar.

A plasma source gas of the passivation operation may be different from the first and second plasma source gases.

A first chamber pressure of the first etching may be lower than a second chamber pressure of the second etching.

Other features and aspects will be apparent from the following detailed description, the drawings, and the claims.

BRIEF DESCRIPTION OF THE DRAWINGS

FIGS. 3A to 3C illustrate a cross-sectional view of a deep trench profile after an etching process in a first cycle, in accordance with one or more embodiment of the disclosure.

FIGS. 9A to 10C illustrate cross-sectional SEM photos of a deep trench according to a manufacturing process of the disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
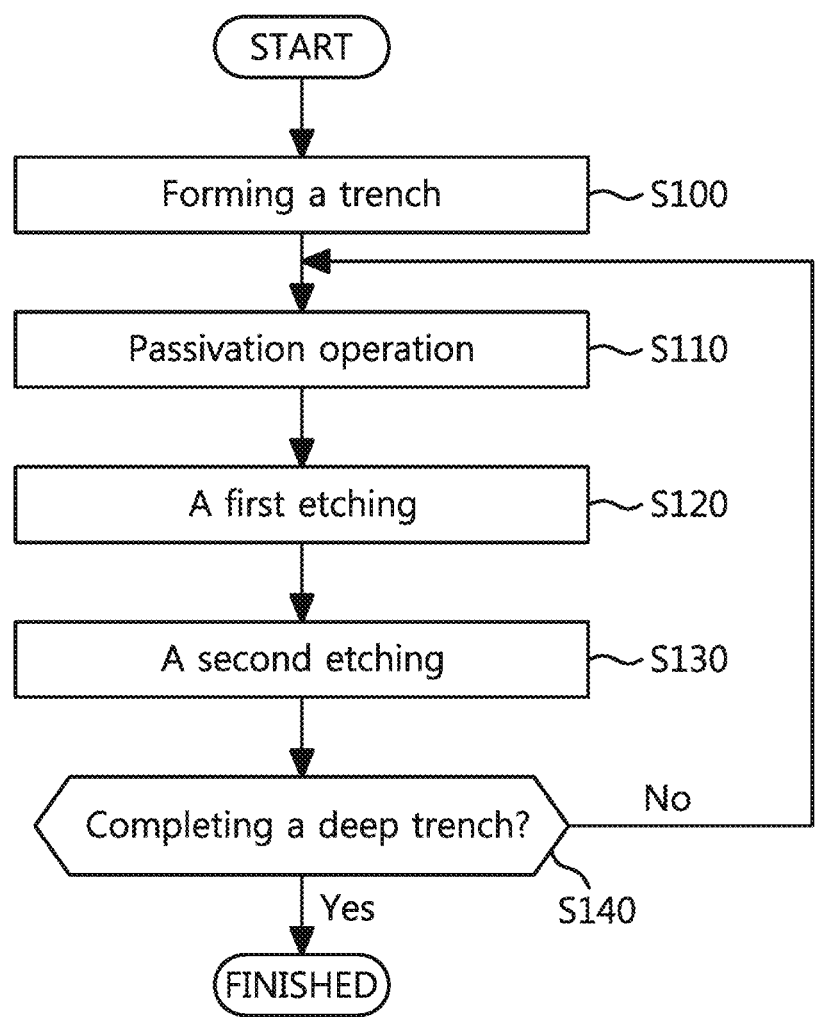
FIG. 1 illustrates a process flow for a deep trench etching method having a scalloped profile in accordance with one or more embodiment of the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible, as will be apparent after an understanding of the disclosure of this application.

Since the capacitance of a deep trench capacitor is proportional to its area, a technology to form a scallop on a sidewall of a deep trench may be desirable to increase the surface area of the deep trench. Optimized etching process conditions may be desired to form a uniform scalloped profile; however, maintaining a uniform scalloped profile poses a challenge as the trench depth deeply increases between 60-100 um, for example.

The disclosure is to solve the above-identified problem, and the disclosure may increase a capacitance of a deep trench capacitor and provide an optimized deep trench etching method to form a uniform scalloped profile while maintaining the trench profile.

A detailed description is given below, with attached drawings.

A typical method to configure a deep trench in a semiconductor substrate is to repeat deposition and etching processes. However, this manufacturing process may cause an undercut on a top of a trench, a trench shape may not be formed with a constant slope, and a scalloped profile may not be uniformly formed. Therefore, a capacity of a deep trench capacitor is not maximized.

The disclosure may remove problems of a typical method and provide a deep trench capacitor where a deep trench may be formed to maximize a capacity of a capacitor in a same area of a substrate. To make a trench capacitor, a trench is formed in a semiconductor substrate, and a conductive film and a dielectric layer are formed in turns in the sidewall of the trench. It may be beneficial that a trench formed in a semiconductor substrate has a scallop to maximize a capacity of a capacitor. Through a manufacturing process of the disclosure, which will be described below, an undercut may be improved, a trench profile may be vertical, and a scallop with a uniform sidewall of a trench may be formed.

FIG. 1 illustrates a process flow for a cross-sectional view of a deep trench profile after an etching process in accordance with one or more embodiment of the disclosure.

Referring to FIG. 1, the disclosure may include forming a trench in a semiconductor substrate (S100), a passivation operation forming a passivation film or a protective film on a surface of the trench (S110), a first etching (S120), and a second etching (S130). The first etching is to partially etch the passivation film or the protective film formed in the passivation operation. The second is to etch the semiconductor substrate exposed by the first etching. Until a deep trench having a desired depth is completed, the cycle with the passivation operation, the first etching, and the second etching may be repeated (S140). Herein, the passivation film or the protective film may be formed by a polymer, including a sort of carbon (C).

The disclosure may suggest an optimal process condition when performing the passivation operation and the etching. For an optimal process condition, experiments are conducted with various bias power, pressure, and flow rate of a plasma source gas, etc. In addition, other elements to form a deep trench may be applied under various other conditions.

Plasma source gases used in the passivation operation and the etching may also be different. A typical plasma source gas used in the passivation operation is octafluorocyclobutane ($C_4F_8$), and a typical plasma source gas used in the etching is sulfur hexafluoride ($SF_6$). Of course, other plasma source gases may be applied to provide identical performance.

Figure 2B:
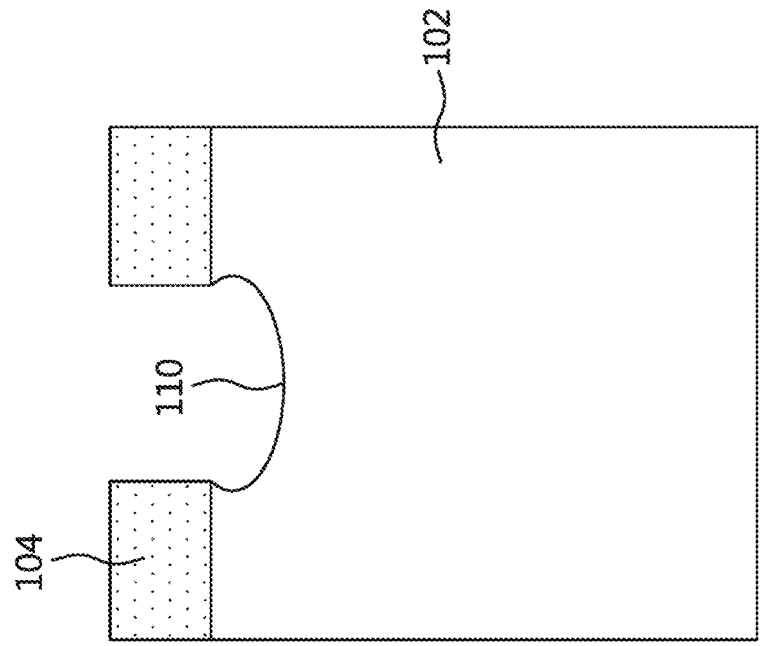
FIGS. 2A and 2B illustrate a cross-sectional view of a deep trench profile after an etching process in accordance with one or more embodiment of the disclosure.
Figure 2A:
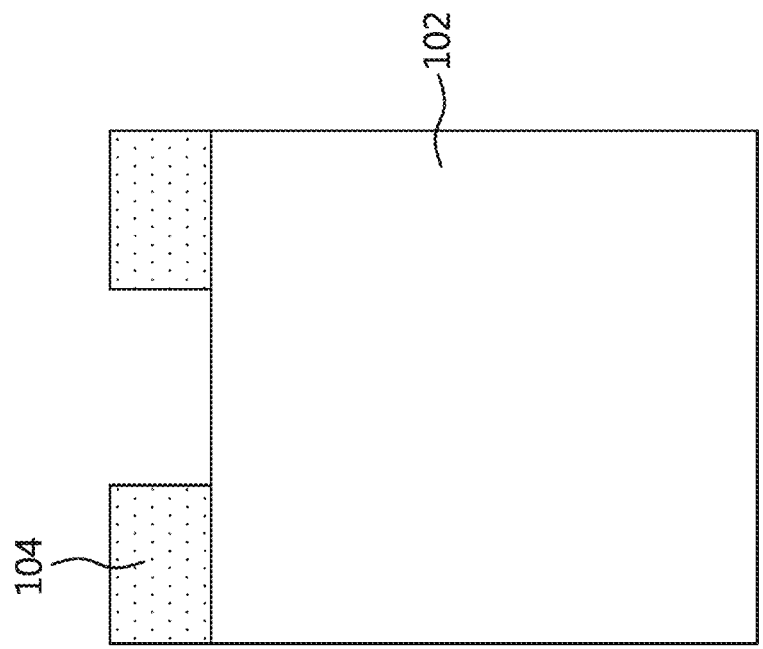

FIGS. 2A and 2B illustrate a cross-sectional view of a deep trench profile after an etching process in accordance with one or more embodiment of the disclosure.

Referring to FIG. 2A, a mask pattern 104 may be formed on a semiconductor substrate 102. The mast pattern 104 may use a photoresist or hard mask material. SiO2 or SiN may be used as the hard mask material. The hard mask material may be preferred for the disclosure to form a trench having a 20-200 um depth.

Referring to FIG. 2B, a first trench 110 may be formed in the semiconductor substrate 102.

An isotropic etching or an anisotropic etching may be performed to form a first trench 110. A rounded trench profile may be obtained if the isotropic etching process was performed, as shown in FIG. 2B. Additionally, an exposed surface area of a trench 110 may be increased when the isotropic etching process is performed. SF6, Cl2, NF3, or CF4 may be used as a plasma source gas for the isotropic etching. Among the plasma source gases, SF6 gas may be mainly used. The isotropic etching may easily make the shape of the first trench 110 be scallop, oval, balloon-shaped, or wave sidewall, which increases the exposed surface area of a first trench 110. If the trench-type capacitor is formed in the deep trench, the capacitance of the trench-type capacitor may be increased.

On the other hand, an anisotropic etching may induce a vertical trench profile. For an anisotropic etching, a plasma source gas combining SF6, HBr, and O2 may be used.

FIGS. 3A to 3C illustrates a cross-sectional view of a deep trench profile after an etching process in a first cycle, in accordance with one or more embodiment of the disclosure. For example, the first cycle may include forming a first passivation film, the first etching, and the second etching.

Referring to FIG. 3A, a first passivation operation or a first deposition operation (in short, $1^{st}$ depo) is performed to form the first passivation film 120 in the first trench 110. The first passivation film 120, such as a thin polymer layer, may be formed on the surface of the rounded first trench 110 in a plasma condition. The first passivation film 120 may protect a surface of the round first trench 110, so the passivation film 120 may be called a protective film 120. Carbon containing source gases, such as CH2F2, CHF3, C4F6, or C4F8, may be implemented to deposit the first passivation film 120 on the surface of the first trench 110. C4F8 gas may have more carbon contents than other gases. The plasma condition may activate the $C_4F_8$, which may be decomposed into activated carbon atoms and fluorine atoms. A thin polymer layer containing the carbon atoms as a first passivation film 120 may be uniformly deposited on the exposed surface of the first trench 110.

A uniform polymer layer deposition may depend on an RF bias power. Plasmas are often generated for processing the wafer in certain equipment used to deposit thin films on semiconductor wafers in the manufacture of semiconductor devices or to etch the films on surfaces of wafers. Such plasmas are into the process chamber of the equipment from a primary RF source. A secondary RF source is used to apply bias to the semiconductor wafer. The RF bias is applied to the wafer from the secondary RF source.

In accordance with one or more embodiment of the disclosure, an RF bias power may be maintained close to 0 to obtain a uniformly deposited polymer layer on the first trench 110. However, if the RF bias power goes beyond a certain level, a uniform thin polymer layer could not be formed on the first trench 110.

Referring to FIG. 3B, the first etching process ($1^{st}$ etch) may be performed with first RF bias power to remove the first passivation film 120 on the bottom of the first trench 110. The first etching process ($1^{st}$ etch) may be reactively ionized etching process, such as SF6 gas may be used as a plasma source gas for the first etching process ($1^{st}$ etch). A first RF bias power may be desired to be high in the first etching to remove the first passivation film 120 on the bottom. Compared to the bottom of the first trench 110, a sidewall of the first trench 110 may be protected by the first passivation film 120 during the first etching ($1^{st}$ etch); however, the thickness of the first passivation film 120 may be decreased after the first etching process.

Referring to FIG. 3C, the second etching process ($2^{nd}$ etch) may be performed with a second RF bias power to form a second trench 210 disposed below the first trench 110. An isotropic etching process may be employed for the second etching process. SF6 plasma source gas may be provided to perform the isotropic etching process. A balloon-shaped profile is obtained after the second etching process. Therefore, silicon (Si), the main material of a semiconductor substrate, may be etched. The second RF bias power employed in the second etching process may be lower than the first RF bias power that of the first etching process.

A second cycle may also be conducted to form $3^{rd}$ trench and comprise a second passivation operation, $3^{rd}$ etching process, and $4^{th}$ etching process.

Figure 4A:
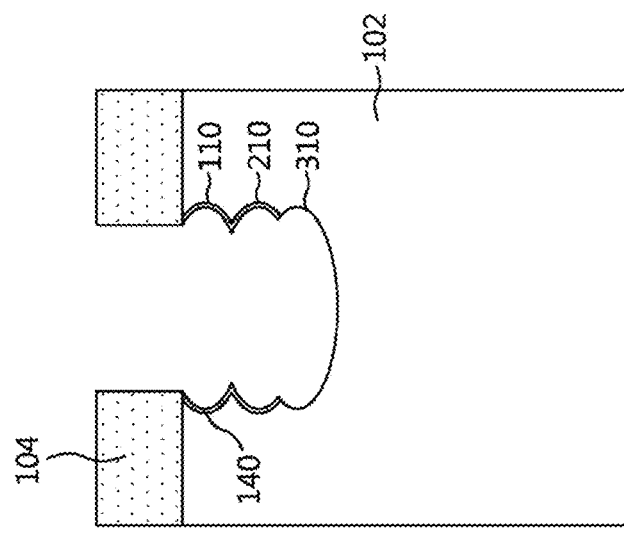
FIGS. 4A to 4C illustrate a cross-sectional view of a deep trench profile after an etching process in a second cycle, in accordance with one or more embodiment of the disclosure.
Figure 4B:
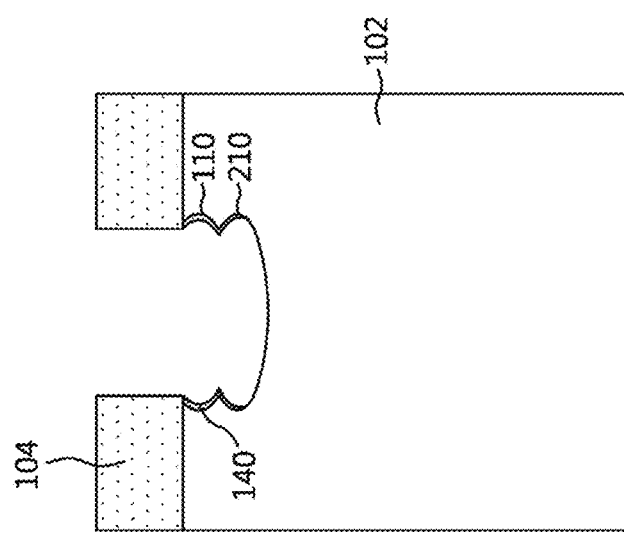
Figure 4C:
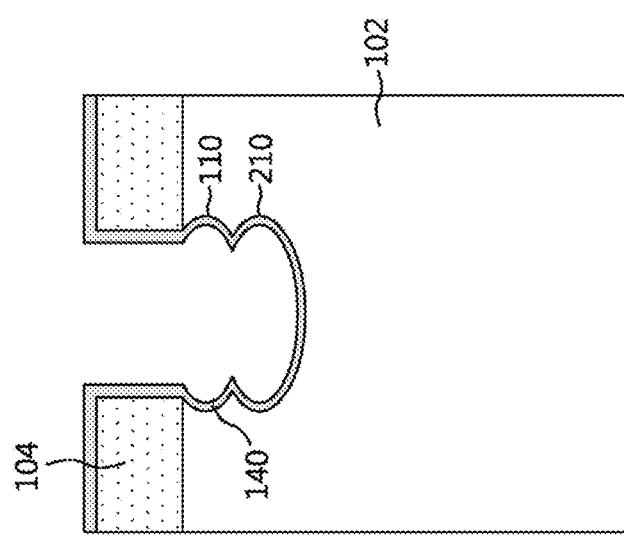

FIGS. 4A to 4C illustrates a cross-sectional view of a deep trench profile after an etching process in a second cycle, in accordance with one or more embodiment of the disclosure.

The second cycle ($2^{nd}$ cycle) may include forming a second passivation film, a third etching, and a fourth etching. The manufacturing process for the second cycle is similar to the first cycle described above. Therefore, a repeated description is omitted.

Referring to FIG. 4A, a second passivation operation or a second deposition ($2^{nd}$ depo) may be performed to form a second passivation film 140 on the sidewall or bottom surface of the first trench 110 and the second trench 210. A condition to form the second passivation film 140 may be somewhat similar to the condition for forming the first passivation film 120. Regardless of the number of cycles, it may be desirable that a plasma source gas flows with a same flow rate in each passivation operation. If a flow rate is increased according to the number of cycles, an unwanted thick passivation film may be formed on a sidewall of the trench. Therefore, a flow rate of C4F8 plasma source gas employed in the second cycle may be maintained as the first cycle.

Referring to FIG. 4B, a third etching ($3^{rd}$ etch) is performed with third RF bias power to remove the passivation film 140 formed on the bottom of the second trench 210. During the third etching ($3^{rd}$ etch), sidewalls of the first trench 110 and the second trench 210 may be protected. The passivation film 140 formed on the bottom of the second trench 210 may be removed or become thinner through the third etching ($3^{rd}$ etch). A condition of the third etching may be somewhat similar to the condition of the first etching. However, it may be desirable that a third RF bias power used in the third etching is greater than a first RF bias power used in the first etching. When a cycle is repeated, or the number of cycles is increased, a passivation film on a bottom of a trench may become thicker correspondingly. Therefore, the RF bias power may be increased to remove the thick passivation film and ensure straightness.

Referring to FIG. 4C, a fourth etching ($4^{th}$ etch) is performed with fourth RF bias power to form a third trench 310. The fourth etching may be performed as an isotropic etching using SF6 plasma source gas to make a profile of the third trench 310 be balloon-shaped, wave-shaped, or scallop.

Many cycles are repeated for a deep trench to have a targeted depth. The deeper a trench is, the larger the number of repeated cycles will be. Each cycle may induce a trench depth of about 10-50 nm. Therefore, the cycle may be repeated hundreds of times to finally form a deep trench with at least 60 um depth. It may be desirable to repeat the above-described process to increase a surface area of a sidewall of a trench.

Figure 5:
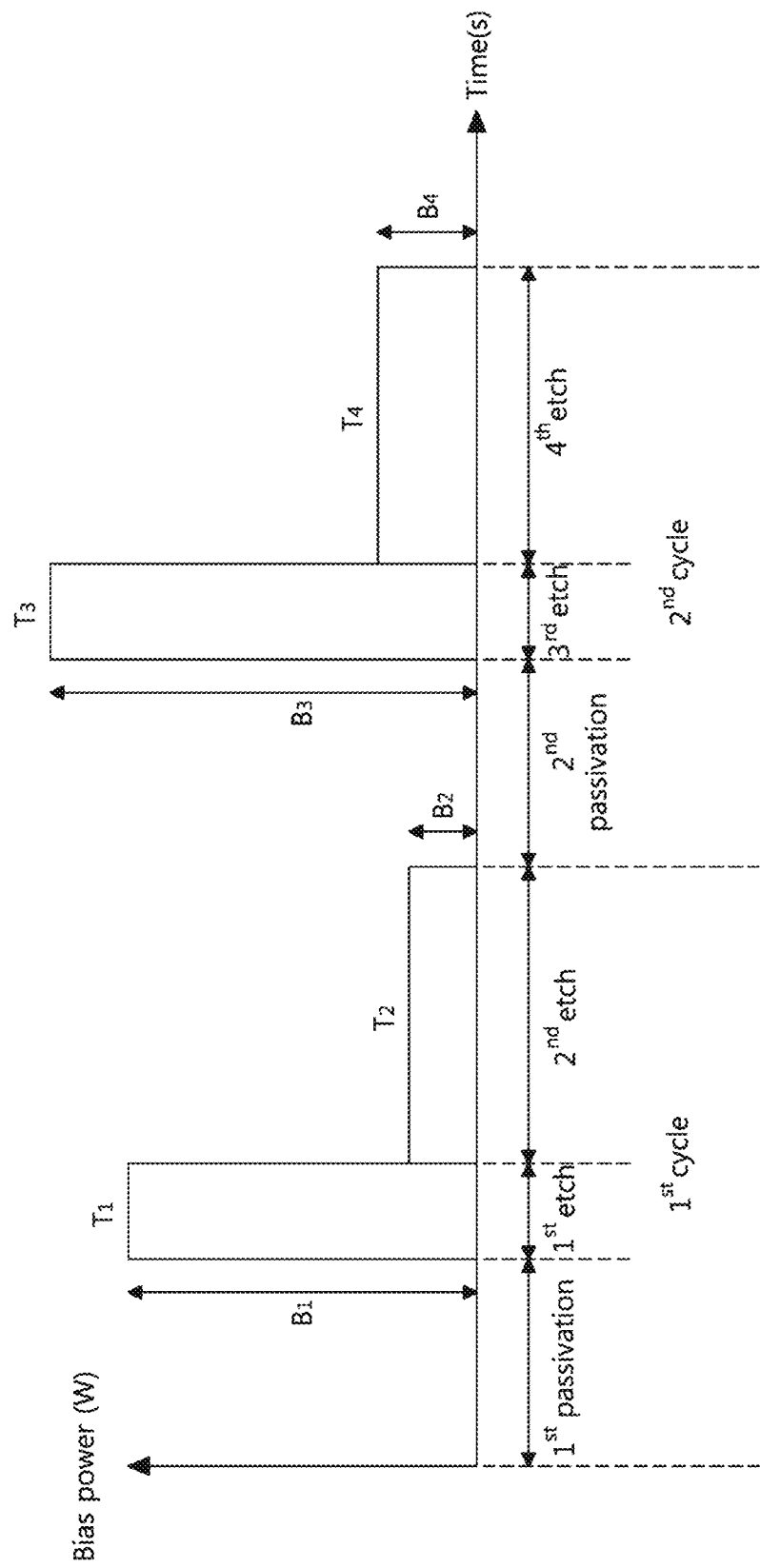
FIG. 5 illustrates a change of bias power by each operation of a deep trench etching method of the disclosure.

FIG. 5 is a graph to illustrate a change of a bias power by each operation of a deep trench etching method of the disclosure.

As shown in FIG. 5, the horizontal axis refers to operation time or processing time, and the vertical axis refers to an RF bias power. The RF bias power may represent the bias power applied to a wafer chuck. The more a bias power is increased, the faster an acceleration of plasma ions toward a wafer becomes, making it possible to create more etching the substrate.

A passivation operation and an etch step are repeated in the horizontal axis as one cycle. An embodiment illustrates two cycles. The $1^{st}$ cycle includes the $1^{st}$ passivation operation, the $1^{st}$ etch, and the $2^{nd}$ etch. Herein, the $1^{st}$ etch is to etch the passivation film, and the $2^{nd}$ etch is to etch a substrate exposed by the $1^{st}$ etch.

Likewise, the $2^{nd}$ cycle includes the $2^{nd}$ passivation operation, the $3^{rd}$ etch, and the $4^{th}$ etch. Herein, the $1^{st}$ passivation and the $2^{nd}$ passivation may be the same as the $1^{st}$ depo and the $2^{nd}$ depo described in FIGS. 3A, 3B, 3C, FIGS. 4A, 4B, and 4C.

First, in the $1^{st}$ cycle, a bias power may be provided differently for each $1^{st}$ passivation operation, $1^{st}$ etch, and $2^{nd}$ etch. The bias power may be hardly provided for the $1^{st}$ passivation operation. On the other hand, more bias power may be provided for the $1^{st}$ etch and the $2^{nd}$ etch than the bias power in the $1^{st}$ passivation operation. Additionally, each bias power and operation time used in the $1^{st}$ etch and the $2^{nd}$ etch are different. More specifically, a first bias power B1 in the $1^{st}$ etch may be greater than a second bias power B2 in the $2^{nd}$ etch to enhance the straightness of plasma source ions in the $1^{st}$ etch. An operation time T2 in the $2^{nd}$ etch may be identical with an operation time T1 in the $1^{st}$ etch, or longer than that. Likewise, through adjusting the bias power and time and repeatedly performing each operation in turns, a trench with a desired depth may be formed in a semiconductor substrate.

Like the $1^{st}$ cycle, a bias power may be provided differently for each $2^{nd}$ passivation operation, $3^{rd}$ etch, and $4^{th}$ etch in the $2^{nd}$ cycle. The bias power may be almost zero provided for the $2^{nd}$ passivation operation. On the other hand, more bias power may be provided for the $3^{rd}$ etch and the $4^{th}$ etch than the bias power in the $2^{nd}$ passivation operation. Bias powers in the $3^{rd}$ etch and the $4^{th}$ etch may have an identical relationship with the above-mentioned relationship between the $1^{st}$ etch, and the $2^{nd}$ etch. That is, a third bias power B3 in the $3^{rd}$ etch may be greater than a fourth bias power B4 in the $4^{th}$ etch.

However, the third bias power B3 used in the $3^{rd}$ etch of the $2^{nd}$ cycle may be greater than the first bias power B1 used in the $1^{st}$ etch of the $1^{st}$ cycle. Likewise, the fourth bias power B4 used in the $4^{th}$ etch of the $2^{nd}$ cycle may be greater than the second bias power B2 used in the $2^{nd}$ etch of the $1^{st}$ cycle. That is, bias powers used in the $1^{st}$ cycle and the $2^{nd}$ cycle may be different. An RF bias power may be increased in the $2^{nd}$ cycle, more than the power of the $1^{st}$ cycle. Herein, as mentioned earlier, the RF bias power refers to an RF bias power connected to the substrate support pedestal. A generated plasma source having gas having straightness may collide toward a wafer in a processing chamber, by the RF bias power. The more the RF bias power is increased, the faster the speed of plasma source gas ions is, and the stronger a straightness becomes.

A trench depth may be deeper as long as cycles are repeated or the number of cycles increases. The passivation film layered on the bottom of the trench may become thicker as much as the trench depth becomes deeper. Therefore, to remove the thick passivation film and ensure more straightness, the number of cycles may become larger, and a bias power may be correspondingly increased gradually.

Figure 6:
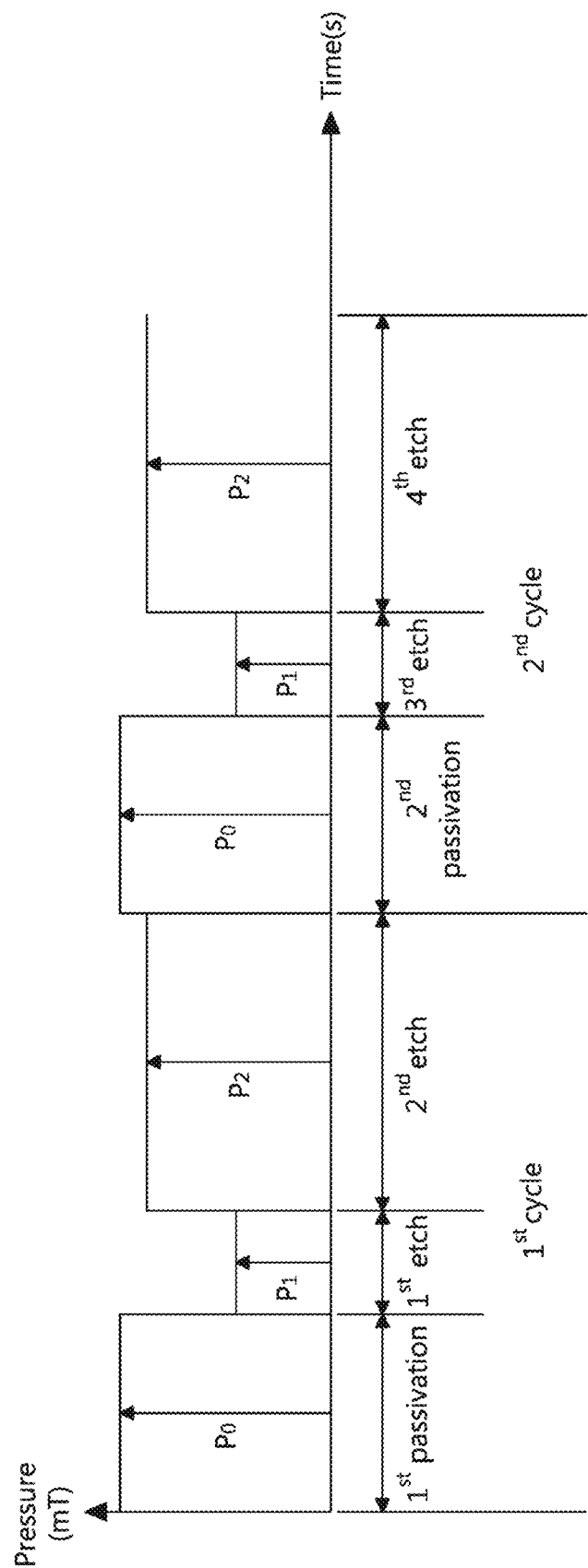
FIG. 6 illustrates a change of chamber pressure by each operation of a deep trench etching method of the disclosure.

FIG. 6 is a graph to illustrate a change of chamber pressure by each operation of a deep trench etching method of the disclosure.

Referring to FIG. 6, a horizontal axis refers to operation time, and a vertical axis refers to a plasma chamber pressure. A chamber pressure (mTorr) may be different in each $1^{st}$ passivation operation, the $1^{st}$ etch, and the $2^{nd}$ etch. A pressure P0 in the $1^{st}$ passivation operation may be relatively greater than a pressure P1 of the $1^{st}$ etch and a pressure P2 of the $2^{nd}$ etch. The pressure P2 of the $2^{nd}$ etch may be greater than the pressure P1 of the $1^{st}$ etch.

Additionally, referring to FIG. 6, process conditions of the $1^{st}$ cycle and the $2^{nd}$ cycle are identical. That is, pressure may be maintained regardless of the number of cycles. Therefore, even though the number of cycles is increased, a pressure in the second cycle may be identical with a pressure in the previous cycle. In one example, the pressure P0 in the $1^{st}$ passivation operation may be identical with the pressure P0 of the $2^{nd}$ passivation operation. The pressure P1 of the $1^{st}$ etch may be identical with a pressure P1 of the $3^{rd}$ etch. The pressure P2 of the $2^{nd}$ etch may be identical with a pressure P2 of the $4^{th}$ etch.

Figure 7:
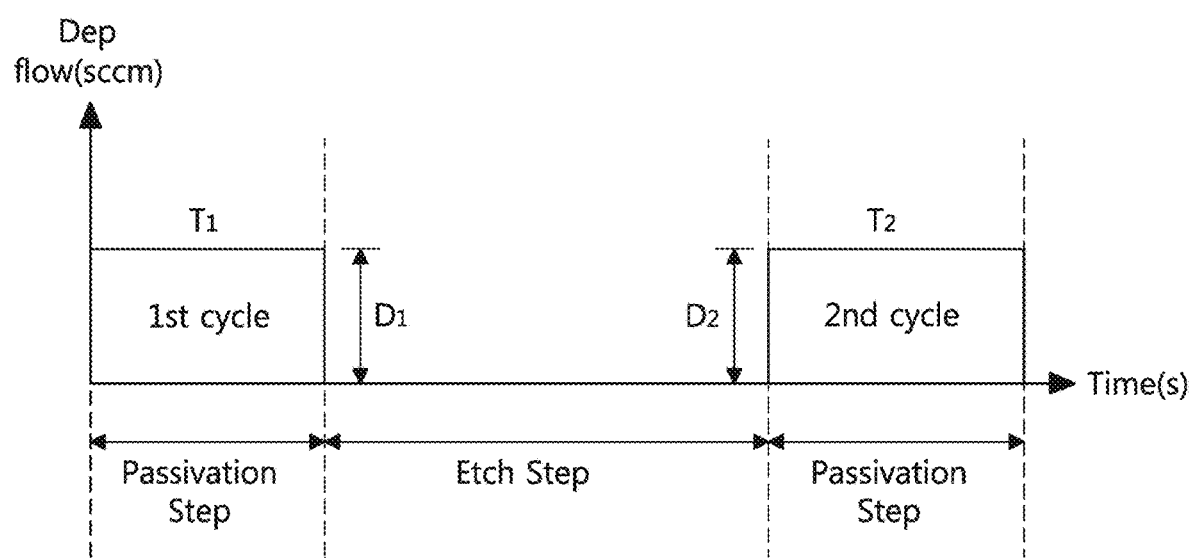
FIG. 7 illustrates a change of a flow rate of gas by each operation of a deep trench etching method of the disclosure.

FIG. 7 is a graph to illustrate a change of a flow rate of gas by each operation of a deep trench etching method of the disclosure.

As shown in FIG. 7, a horizontal axis refers to operation time, and a vertical axis refers to a flow rate of $C_4F_8$ plasma source gas used in the passivation operation. The vertical axis refers to the flow rate of plasma source gas of $C_4F_8$ used in the passivation operation. The flow rate of $C_4F_8$ plasma source gas is almost 0 in etching operations, which are the first etching and the second etching, because a main plasma source gas for the etching operations is changed to SF6. The flow rate may not be changed regardless of the number of cycles. Therefore, even though the number of cycles is increased, a flow rate D2 of the second cycle may be identical with a flow rate D1 of the previous cycle. The passivation operation may be repeated until a trench having a predetermined depth is formed in a semiconductor substrate, and whenever a cycle is conducted, a flow rate may be supplied that is identical with a flow rate of plasma source gas in the previous cycle.

As described above, the disclosure may independently apply a bias power, pressure, a flow rate of plasma source gas, etc., and it may be also possible to apply these conditions together.

FIG. 8 illustrates a cross-sectional SEM photo and a plane SEM photo of a deep trench in accordance with one or more embodiment of the disclosure.

Figure 8B:
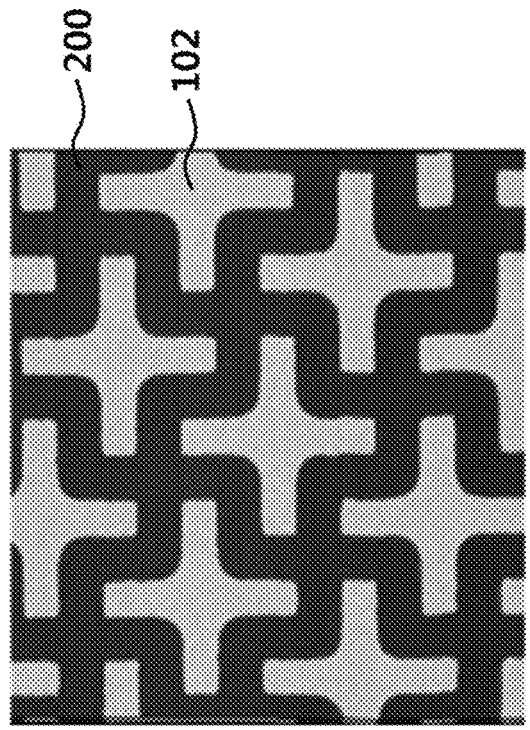
FIGS. 8A and 8B illustrate a cross-sectional SEM photo and a plane SEM photo of a deep trench in accordance with one or more embodiment of the disclosure.
Figure 8A:
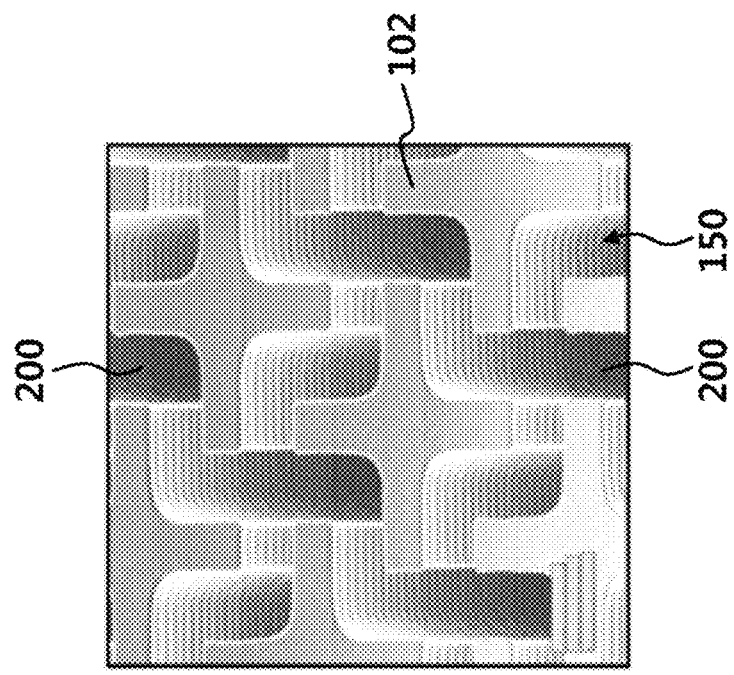

As shown in FIG. 8A and FIG. 8B, to maximize a surface area of a trench, a shape of a sidewall of a trench 200 may be formed to be a scallop 150, balloon-shaped 150, or a wave sidewall 150. A deep trench 200 may be formed like a cross shape. Other shapes are possible in addition to a cross shape. The deep trench 200 may be formed to be almost vertical, and the scallop 150 may be uniformly formed on a sidewall of the deep trench 200. Additionally, the deep trench 200 may be connected to other deep trenches, and all deep trench may be connected as a whole. A capacitance of a deep trench capacitor may be increased correspondingly.

FIG. 9 illustrates a cross-sectional SEM photo of a deep trench according to a manufacturing process of the disclosure.

Figure 9B:
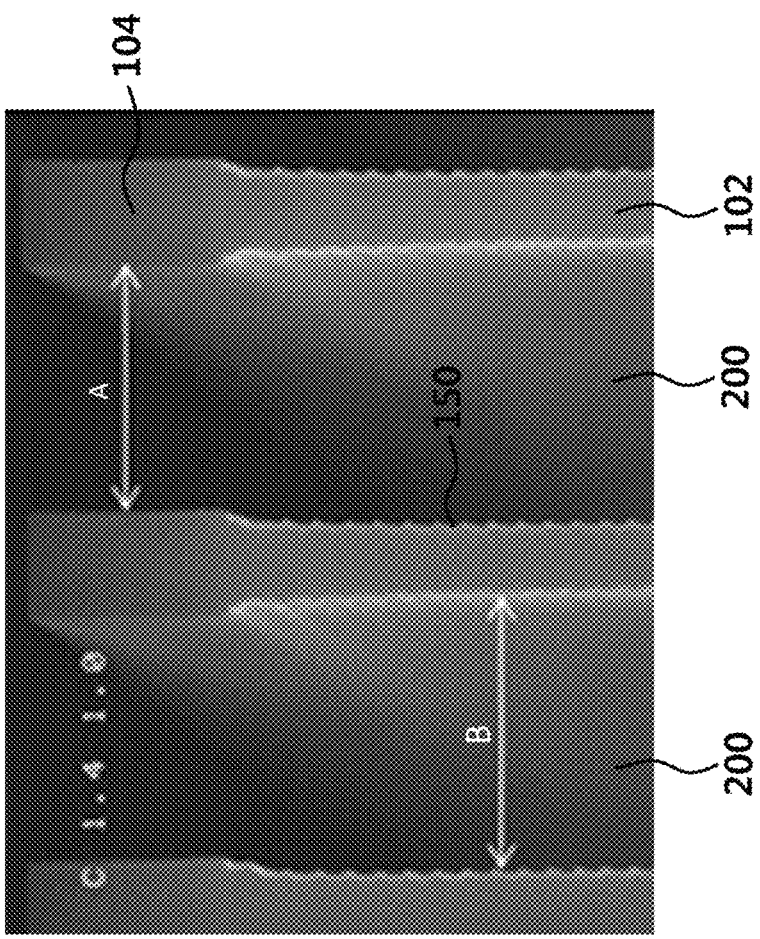
Figure 9A:
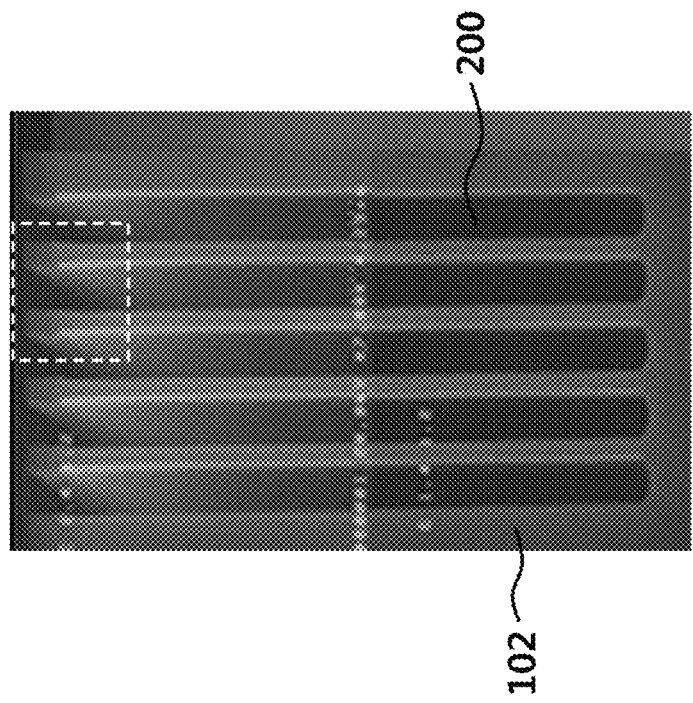

As shown in FIG. 9A, a plurality of trenches 200 may be formed. Additionally, each trench 200 may have a verticality from top to bottom.

Moreover, as shown in FIG. 9B, the scallop 150 having a uniform shape may be formed on a sidewall of the deep trench 200. As described earlier, in a deposition operation and an etching operation, when a passivation operation and an etching operation are performed with adjusting a bias power, pressure, flow rate of plasma source gas, etc., it may be possible to manufacture a trench structure having a maximized capacity of a capacitor. That is, an undercut may not occur on a top of the trench. Also, a width 'B' in sidewall the trench may be wider than a width 'A' between mask patterns 104 due to an isotropic etching using SF6 plasma source gas.

FIG. 10 illustrates a cross-sectional SEM photo of a deep trench according to a manufacturing process of the disclosure.

According to one or more embodiment of the disclosure, when conditions such as a bias power, pressure, flow rate of plasma source gas, etc. are different during the passivation operation, the first etching, and the second etching, a trench profile may be variously formed.

As shown in FIG. 10, (a) illustrates a positive profile where a top width W1 of the deep trench is wider than a bottom width W2. (b) illustrates a vertical profile where a width W of the trench is formed uniformly, and (c) illustrates a negative profile where a bottom width W2 of the deep trench is wider than a top width W1. Accordingly, it may be possible to freely form a shape of a trench with the disclosure.

Figure 11:
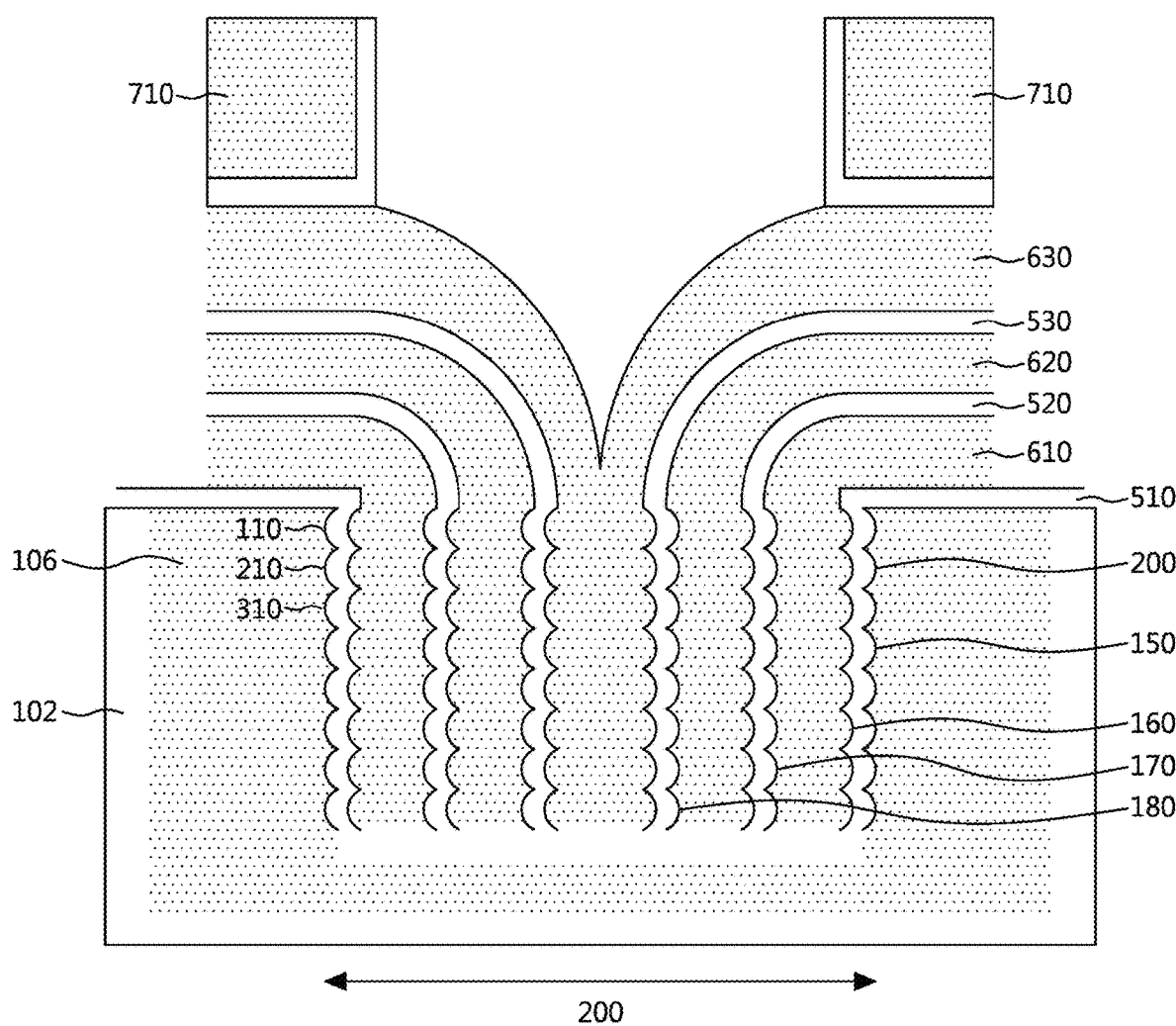
FIG. 11 illustrates a deep trench capacitor manufactured by a deep trench etching method of the disclosure.

FIG. 11 illustrates a deep trench capacitor manufactured by a deep trench etching method of the disclosure.

As shown in FIG. 11, a conductive doping region 106 may be formed in a substrate 102. By using an etching process of the disclosure for the conductive doping region 106, the deep trench 200 may be formed having a plurality of balloon-shaped profiles 150. The deep trench 200 may comprise a plurality of trenches, such as the first, second and third trenches 110, 210 and 310, etc. The first trench 110 is closer to a top substrate than the second trench 210. The second trench 210 is disposed below the first trench 110, and the third trench 310 is below the second trench 210.

A first dielectric layer 510 is formed on at least the first, second and third trenches 110, 210 and 310; a first conductive film 610 is formed on the first dielectric layer 510; a second dielectric layer 520 is formed on the first conductive film 610; a second conductive film 620 is formed on the second dielectric layer 520; a third dielectric layer 530 is formed on the second conductive film 620; and a third conductive film 630 is formed on the third dielectric layer 530.

Thereby, a first dielectric layer 510, a first conductive film 610, a second dielectric layer 520, a second conductive film 620, a third dielectric layer 530, and a third conductive film 630 may be stacked in order in sidewall the deep trench 200. Herein, each of the first, second and third conductive films 610, 620 and 630 may use a poly-silicon material. Each of the first, second and third dielectric layers 510, 520 and 530 may use one selected from a silicon oxide, silicon nitride, silicon oxynitride (SiON), or high-k materials such as Ta2O5, HfO2, Al2O3, etc. Stacking layers combined the above-discussed insulating materials may be also used as a dielectric layer. Therefore, a plurality of capacitors may be formed.

As illustrated in the figure, by the balloon-shaped bend 150, the first dielectric layer 510, the first conductive film 610, the second dielectric layer 520, the second conductive film 620, the third dielectric layer 530, and the third conductive film 630 may also have multiple balloon-shaped profiles 106, 170, 180. In this example, surface areas of the first dielectric layer 510, the first conductive film 610, second dielectric layer 520, the second conductive film 620, the third dielectric layer 530, and the third conductive film 630 may be increased. That is, compared with an example without balloon-shaped profiles 106, 170, 180, the surface area may be increased by the rounded shape. Therefore, a surface area may be increased. Accordingly, a capacitance per unit area may be increased. Herein, each dielectric layer may use an oxide/nitride/oxide film.

Additionally, a contact plug 710 may be formed on the third conductive film 630. The contact plug 710 may be electrically connected to the first conductive film 610. The conductive doping region 106 and the second conductive film may be electrically connected, and the first conductive film 610 and the third conductive film 630 may be electrically connected, which may make a parallel capacitor. In this example, a capacity of a capacitor may be increased. Another way to increase a capacity of a capacitor for the disclosure is to connect a poly in parallel.

Figure 12A:
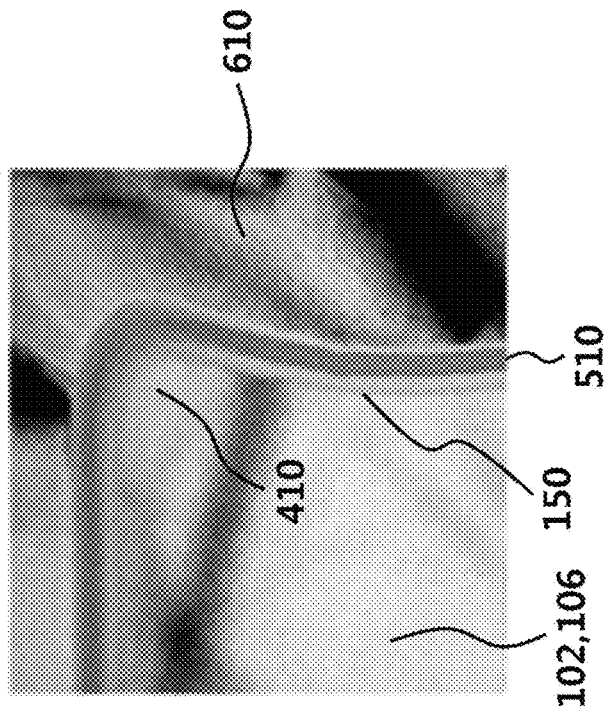
FIGS. 12A and 12B illustrate a cross-sectional SEM photo of a deep trench capacitor manufactured by a deep trench etching method of the disclosure.
Figure 12B:
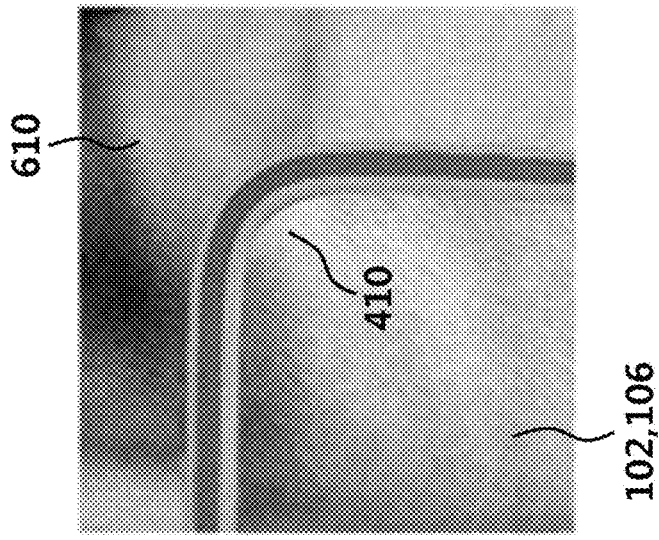

FIGS. 12A and 12B illustrate a cross-sectional SEM photo of a deep trench capacitor manufactured by a deep trench etching method of the disclosure.

FIG. 12A is a cross-sectional SEM photo of a deep trench capacitor near a trench top corner 410 where a scallop is not formed. The first dielectric layer 510 having a curved shape may be formed at the top corner 410 region, and the first conductive film 610 may be formed above it.

FIG. 12B is a cross-sectional SEM photo of a deep trench capacitor near a trench top corner 410 where the scallop 150 is formed by the trench etching method of the disclosure. The highly curved first dielectric layer 510 may be formed in the top corner 410 region, and the first conductive film 610 may be formed above it. The scallop 150 may be formed right under the top corner 410 region. The scallop 150 of the disclosure may be formed better. As described earlier, since an electronic path becomes longer than typical cases, a capacitance may be increased.

As described above, the disclosure may repeatedly perform the passivation operation to form a polymer, the first etching to remove the formed polymer, and the second etching to remove a silicon when the polymer is removed, by providing a bias power, pressure, flow rate of plasma source gas, etc. according to a predetermined condition for manufacturing process of a trench capacitor. Accordingly, a depth of trench may be deep, and a trench may be vertical from top to bottom. Also, it may be possible to form a scallop uniformly on a sidewall of the trench, and the capacity of the capacitor may be maximized in the same area.

According to the disclosure, by using an optimized etching condition, a deep trench may be formed having a uniform scallop on a sidewall of the trench, with maintaining a profile of the trench uniformly.

Additionally, according to the disclosure, a deep trench may be formed using an optimized etching condition with one of a positive trench profile, vertical trench profile, or negative trench profile.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method for forming a deep trench, the method comprising:
    forming a first trench in a substrate; and
    performing a first cycle followed by a second cycle, each cycle comprising:
        performing a passivation operation to form a passivation film on a sidewall and a bottom surface of the first trench;
        performing a first etching with a first bias power to remove the passivation film formed on the bottom surface of the first trench to expose the bottom surface of the first trench; and
        performing a second etching with a second bias power to etch the exposed bottom surface of the first trench to form a second trench disposed below the first trench,
    wherein the performing of the first etching comprises performing a reactively ionized etching with the first bias power greater than the second bias power to remove the passivation film on the bottom and protect the passivation film on the sidewall of the first trench,
    wherein the performing of the second etching comprises performing an isotropic etching with the second bias power to form the second trenches each having a balloon-shaped or scallop-shaped sidewall, and
    wherein each of the first and second bias powers is increased as a number of repeated cycle is increased to form the deep trench.

2. The method of claim 1, wherein the first etching and the second etching are performed with a first plasma source gas and a second plasma source gas, respectively, and
    wherein the first plasma source gas and the second plasma source gas are similar.

3. The method of claim 2, wherein a plasma source gas of the passivation operation is different from the first and second plasma source gases.

4. The method of claim 1, wherein a first chamber pressure employed in the first etching is lower than a second chamber pressure employed in the second etching.

5. The method of claim 1, wherein each of the first cycle and the second cycle has a same gas flow rate in the passivation operation.

6. The method of claim 1, wherein the deep trench is formed in a crisscross pattern and is connected to all other deep trenches.

7. The method of claim 1, wherein the second bias power of the second etching is greater than a bias power of the passivation operation and less than the first bias power of the first etching.

8. A manufacturing method for forming a deep trench capacitor, the method comprising:
    forming a first trench having a first depth in a substrate;
    performing a passivation operation to form a protective film on a surface of the first trench;
    performing a first etching to remove a portion of the protective film;
    performing a second etching to form a second trench having a second depth under the first trench by etching the substrate, such that each of the first and second trenches has a scalloped profile;

forming a first dielectric layer on the first and second trenches;
forming a first conductive film on the first dielectric layer;
forming a second dielectric layer on the first conductive film;
forming a second conductive film on the second dielectric layer;
forming a third dielectric layer on the second conductive film; and
forming a third conductive film on the third dielectric layer,
wherein the performing of the first etching comprises performing a reactively ionized etching with a first bias power greater than a second bias power of the second etching to remove the protective film on a bottom and protect the protective film on a sidewall of the first trench,
wherein the performing of the second etching comprises performing an isotropic etching with the second bias power to form the second trench, and
wherein each of the first and second bias powers is increased as a number of repeated cycle is increased to form a deep trench.

9. The method of claim 8, further comprising:
forming a conductive doping region in the substrate; and
forming a contact plug contacting the third conductive film, and
wherein the first conductive film and the third conductive film are electrically connected to each other.

10. The method of claim 8, wherein a plasma source gas from the passivation operation is different from plasma source gases from the first etching and the second etching,
wherein the plasma source gas from the passivation operation is Octafluorocyclobutane ($C_4F_8$) plasma source gas, and
wherein the plasma source gases from the first etching and the second etching is sulfur hexafluoride ($SF_6$) plasma source gas.

11. The method of claim 8, wherein each end of the deep trench capacitor is connected to an adjacent deep trench capacitor.

12. A manufacturing method, comprising:
forming a trench in a substrate; and
sequentially performing a plurality of cycles, each of the plurality of cycles comprising:
forming a passivation film on a sidewall and a bottom surface of the trench;
performing a first etching with a first bias power to remove the passivation film formed on the bottom surface of the trench to expose the bottom surface of the trench; and
performing a second etching with a second bias power to etch the exposed bottom surface of the trench to form another trench disposed below the trench,
wherein the performing of the first etching comprises performing a reactively ionized etching with the first bias power greater than the second bias power to remove the passivation film on the bottom and protect the passivation film on the sidewall of the trench,
wherein the performing of the second etching comprises performing an isotropic etching with the second bias power to form the another trench having a oval-shaped sidewall, and
wherein each of the first and second bias powers is increased as a number of repeated cycle is increased to form a deep trench.

13. The method of claim 12, wherein the first etching and the second etching are performed with a first plasma source gas and a second plasma source gas, respectively, and
wherein the first plasma source gas and the second plasma source gas are similar.

14. The method of claim 13, wherein a plasma source gas of the passivation operation is different from the first and second plasma source gases.

15. The method of claim 12, wherein a first chamber pressure of the first etching is lower than a second chamber pressure of the second etching.

* * * * *